US009748250B2

(12) United States Patent
Hoyos et al.

(10) Patent No.: US 9,748,250 B2
(45) Date of Patent: Aug. 29, 2017

(54) DEEP TRENCH SIDEWALL ETCH STOP (71) Applicant: International Business Machines Corporation, Armonk, NY (US)

(72) Inventors: Diego A. Hoyos, Hopewell Junction, NY (US); Sunit S. Mahajan, Somers, NY (US); William L. Nicol, Hopewell Junction, NY (US); Iqbal R. Saraf, Albany, NY (US); Scott R. Stiffler, Sharon, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/733,156

(22) Filed: Jun. 8, 2015

(65) Prior Publication Data
US 2016/0358954 A1   Dec. 8, 2016

(51) Int. Cl.
*H01L 27/13* (2006.01)
*H01L 27/108* (2006.01)
*H01L 49/02* (2006.01)
*H01L 29/66* (2006.01)
(Continued)

(52) U.S. Cl.
CPC ........ *H01L 27/1087* (2013.01); *H01L 27/108* (2013.01); *H01L 27/1203* (2013.01); *H01L 27/13* (2013.01); *H01L 28/40* (2013.01); *H01L 29/66181* (2013.01); *H01L 29/945* (2013.01); *H01L 27/10861* (2013.01)

(58) Field of Classification Search
CPC ........... H01L 29/66181; H01L 27/1087; H01L 29/945; H01L 27/10861; H01L 27/10829; H01L 27/1203; H01L 27/1207
See application file for complete search history.

(56) References Cited

U.S. PATENT DOCUMENTS 5,770,484 A * 6/1998 Kleinhenz ......... H01L 29/66181
                                              257/E21.396
6,429,477 B1    8/2002 Mandelman et al.
(Continued)

OTHER PUBLICATIONS

D. L. O'Meara et al.; Silicon Nitride Molecular Layer Deposition Process Development using Dichlorosilane and Ammonia; The Electrochemical Society, Meeting Abstracts, No. 21, 2006, p. 1064.

*Primary Examiner* — Tom Thomas
*Assistant Examiner* — John Bodnar
(74) *Attorney, Agent, or Firm* — Steven J. Meyers; Howard M. Cohn; Daniel M. Cohn (57) ABSTRACT

Embodiments of the present invention provide a structure and method for fabrication of deep trenches in semiconductor-on-insulator structures. An upper portion of the deep trench cavity is formed to expose a sidewall of the buried insulator layer. A protective layer is disposed on the sidewall of the buried insulator layer. Then, the cavity is extended into the bulk substrate. The protective layer prevents over etch of the buried insulator layer during this process. The protective layer is then partially removed, such that the semiconductor-on-insulator (SOI) layer sidewall is exposed. The trench is then filled with a conductive fill material, such as polysilicon. The protection of the buried insulator (BOX) layer allows the trenches to be placed closer together while reducing the risk of a short circuit due to over etch, thereby increasing circuit density and product yield.

12 Claims, 6 Drawing Sheets

(51) Int. Cl.
*H01L 29/94* (2006.01)
*H01L 27/12* (2006.01)

(56) References Cited

U.S. PATENT DOCUMENTS

| | | |
|---|---|---|
| 6,617,210 B1 * | 9/2003 | Chau ............... H01L 21/28194 |
| | | 438/240 |
| 6,653,678 B2 | 11/2003 | Chidambarrao et al. |
| 7,009,237 B2 | 3/2006 | Adkisson et al. |
| 8,030,707 B2 | 10/2011 | Cheng et al. |
| 8,354,675 B2 | 1/2013 | Kwon et al. |
| 8,421,139 B2 | 4/2013 | Kanakasabapathy et al. |
| 2002/0036313 A1 * | 3/2002 | Yang ..................... H01L 28/55 |
| | | 257/306 |
| 2002/0093781 A1 * | 7/2002 | Bachhofer ........ H01L 21/31604 |
| | | 361/312 |
| 2005/0026384 A1 * | 2/2005 | Kudelka ........... H01L 27/10829 |
| | | 438/386 |
| 2010/0038694 A1 * | 2/2010 | Anderson ........ H01L 27/10823 |
| | | 257/303 |
| 2013/0032929 A1 | 2/2013 | Leobandung |
| 2013/0092992 A1 | 4/2013 | Chang et al. |
| 2013/0320422 A1 | 12/2013 | Chang et al. |

\* cited by examiner

DEEP TRENCH SIDEWALL ETCH STOP

FIELD OF THE INVENTION

The present invention relates generally to semiconductor fabrication, and more particularly, to fabrication of deep trenches used for forming capacitors in an integrated circuit.

BACKGROUND OF THE INVENTION

Capacitors have a wide variety of applications in electronic circuits. In particular, for semiconductor integrated circuits, deep trench capacitors are often used. For memory circuits such as DRAM (dynamic random access memory) arrays, capacitors play an important role in operation, performance, and density of such arrays. Deep trenches, typically having a depth exceeding 1 micron, are employed in the semiconductor industry to provide a variety of useful devices including a deep trench capacitor. The deep trenches may be utilized in a stand-alone semiconductor circuit such as a dynamic random access memory (DRAM) circuit to provide deep trench capacitors, or may be utilized as an embedded circuit component of a semiconductor chip that also includes other semiconductor circuits such as a processor core or other logic circuits. Particularly, embedded deep trench capacitors may be used to enable an embedded memory device, for example, an embedded dynamic random access memory (eDRAM) cell, a passive component of a radio frequency (RF) circuit, or a decoupling capacitor that provides a stable voltage supply in a semiconductor circuit.

Semiconductor-on-insulator (SOI) substrates are employed in the semiconductor industry for performance benefits due to reduced capacitive coupling between semiconductor devices and the bulk portion of the substrate. The reduced capacitive coupling may be provided by a buried insulator layer. The buried insulator layer separates a bulk substrate below from a SOI layer above. The SOI layer may be considered the active layer where semiconductor devices may be formed. High performance logic chips are frequently manufactured on a SOI substrate to provide enhanced performance over devices having comparable dimensions and manufactured on a bulk substrate.

Generally, deep trench capacitors may include two electrical conductors separated by an insulator. One electrical conductor, commonly referred to as a buried plate, may typically be formed in the bulk substrate. The insulator, which may be referred to as a node dielectric, may be formed within the deep trench on top of the buried plate. The other electrical conductor, which may be referred to as an inner electrode, may be formed within the deep trench on top of the node dielectric. Therefore, the deep trench capacitor may include the inner electrode and the buried plate separated by the node dielectric. The conductors, for example the buried plate and the inner electrode, may preferably be very conductive. As the deep trench capacitor is an important part of many integrated circuit designs, it is therefore desirable to have improvements in structures and methods for fabricating deep trenches.

SUMMARY OF THE INVENTION

In a first aspect, embodiments of the present invention provide a method of forming a semiconductor structure, comprising: forming an upper portion cavity in a semiconductor-on-insulator structure comprising a semiconductor-on-insulator (SOI) layer, a buried insulator layer, and a bulk semiconductor substrate; forming a conformal insulator layer in the upper portion cavity; extending the upper portion cavity into the bulk semiconductor substrate to form an extended cavity; forming a capacitor stack in the extended cavity; removing the capacitor stack from a portion of the upper portion cavity to expose a portion of an inner sidewall of the buried insulator layer; removing the conformal insulator layer from the exposed portion of the inner sidewall of the buried insulator layer; and filling the extended cavity with a conducting material.

In a second aspect, embodiments of the present invention provide a semiconductor structure, comprising: a bulk semiconductor substrate; a buried insulator layer disposed on the bulk semiconductor substrate; a semiconductor-on-insulator (SOI) layer disposed on the buried insulator layer; a cavity formed within the SOI layer and traversing the buried insulator layer and extending partially into the bulk semiconductor substrate; a buried insulator protection layer disposed on a lower portion of an inner sidewall of the buried insulator layer; and a conductive fill material filling the cavity.

In a third aspect, embodiments of the present invention provide a semiconductor structure, comprising: a bulk semiconductor substrate; a buried insulator layer disposed on the bulk semiconductor substrate; a semiconductor-on-insulator (SOI) layer disposed on the buried insulator layer; a cavity formed within the SOI layer and traversing the buried insulator layer and extending partially into the bulk semiconductor substrate; a buried insulator protection layer disposed on a lower portion of an inner sidewall of the buried insulator layer, wherein the lower portion comprises between 25 percent to 70 percent of the inner sidewall; and a conductive fill material filling the cavity.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGS.) of the drawing, in which case typically the last two significant digits may be the same, the most significant digit being the number of the drawing figure (FIG.). Furthermore, for clarity, some reference numbers may be omitted in certain drawings.

DETAILED DESCRIPTION

Embodiments of the present invention provide an improved structure and method for fabrication of deep trenches in semiconductor-on-insulator structures. An upper portion of the deep trench cavity is formed to expose a sidewall of the buried insulator layer. A protective layer is disposed on the sidewall of the buried insulator layer. Then, the cavity is extended into the bulk substrate. The protective layer prevents over etch of the buried insulator layer during this process. The protective layer is then partially removed, such that the semiconductor-on-insulator (SOI) layer sidewall is exposed. The trench is then filled with a conductive fill material, such as polysilicon. The protection of the buried insulator (BOX) layer allows the trenches to be placed closer together while reducing the risk of a short circuit due to over etch, thereby increasing circuit density and product yield.

Figure 1:
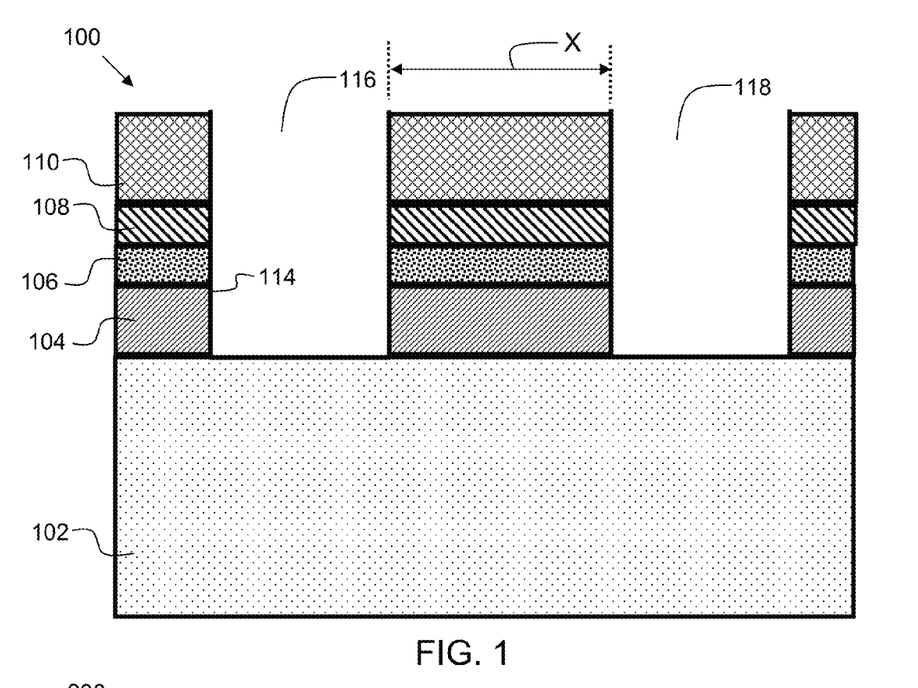
FIG. 1 is a semiconductor structure at a starting point for embodiments of the present invention.

FIG. 1 is a semiconductor structure 100 at a starting point for embodiments of the present invention. Semiconductor structure 100 comprises bulk semiconductor substrate 102. In embodiments, substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. A buried insulator layer 104 is disposed on the semiconductor substrate 102. In embodiments, insulator layer 104 may be comprised of silicon oxide, and may be referred to as a buried oxide (BOX) layer. A semiconductor-on-insulator (SOI) layer 106 is disposed on the insulator layer 104. In embodiments, the SOI layer 106 may be comprised of the same material as the bulk substrate. In other embodiments, the material used for the SOI layer 106 may differ from that of the bulk substrate. A pad layer 108 is disposed on the SOI layer. In embodiments, the pad layer 108 is comprised of silicon nitride. A hardmask layer 110 is disposed on the pad layer 108. In embodiments, the hardmask layer 110 is comprised of silicon oxide. Cavities 116 and 118 are formed in layers 104-110 to expose the bulk semiconductor substrate 102. The cavities 116 and 118 have an inner sidewall, indicated by reference 114. In embodiments, anisotropic etching is used to form cavities 116 and 118. Cavity 116 and cavity 118 are referred to as upper portion cavities, since they do not yet extend into the bulk semiconductor substrate 102. Cavity 116 and cavity 118 are separated by a distance X. It is preferable to have X as small as possible to increase circuit density. However, if X is too small, then it increases the chance of manufacturing defects that adversely affect product yield. It is therefore desirable to have structures and methods that allow for a reduction in distance X while reducing the chance of manufacturing defects.

Figure 2:
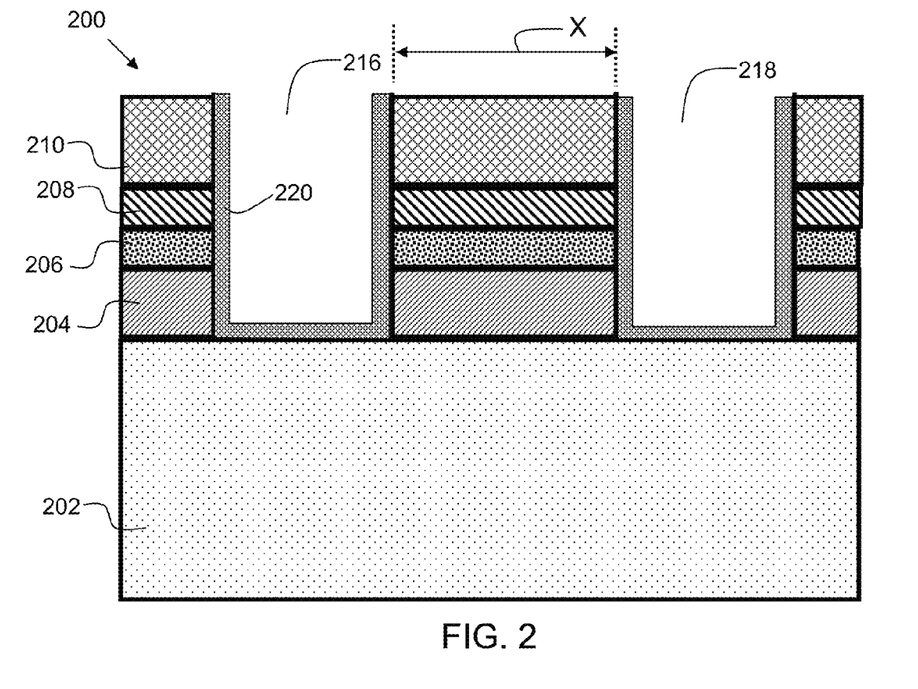
FIG. 2 is a semiconductor structure after a subsequent process step of depositing a conformal nitride layer.

FIG. 2 is a semiconductor structure 200 after a subsequent process step of depositing a conformal nitride layer 220. As stated previously, similar elements may be referred to by similar numbers in various figures (FIGS.) of the drawing, in which case typically the last two significant digits may be the same. For example, bulk substrate 202 of FIG. 2 is similar to bulk substrate 102 of FIG. 1. The nitride layer 220 may be a silicon nitride layer. In embodiments, the nitride layer 220 is deposited via molecular layer deposition (MLD) or atomic layer deposition (ALD). In embodiments, the nitride layer 220 has a thickness ranging from about 8 nanometers to about 20 nanometers. The role of the nitride layer 220 is to serve as a buried insulator protection layer and it protects the insulator layer 204 during subsequent processing steps. Without the nitride layer 220, the buried insulator layer 204 is prone to unwanted isotropic etching. If the dimension X is small enough, the isotropic etching can cause a short between the two cavities 216 and 218, which introduces a manufacturing defect.

Figure 3:
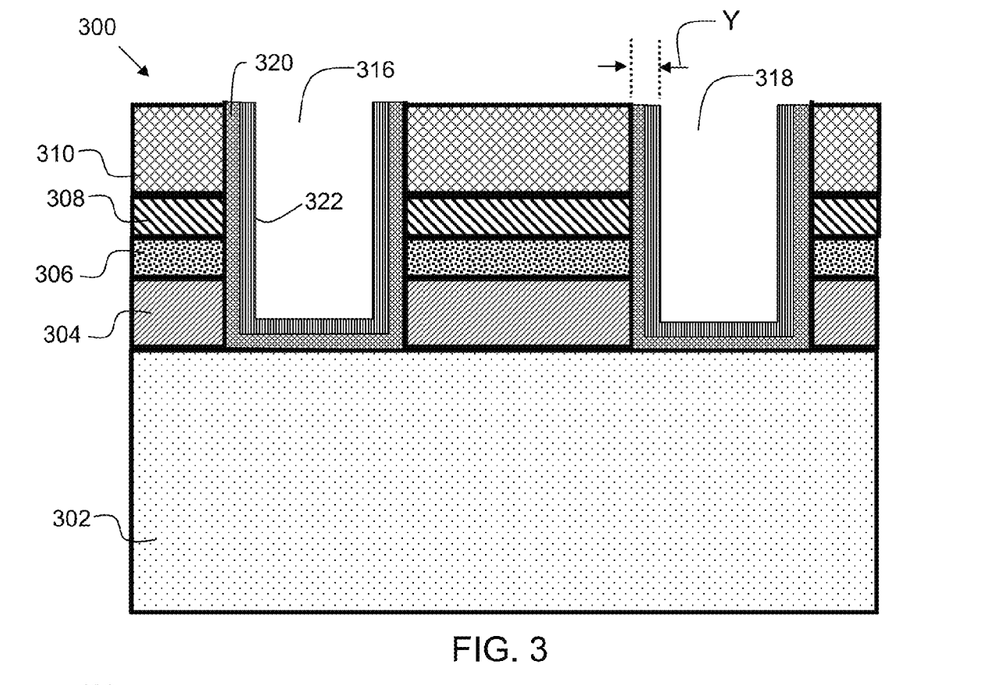
FIG. 3 is a semiconductor structure after a subsequent process step of depositing a conformal oxide layer.

FIG. 3 is a semiconductor structure 300 after a subsequent optional process step of depositing a conformal oxide layer 322. If the nitride layer 320 is sufficiently thick to survive the downstream etch processes, then the conformal oxide layer 322 is not necessary. However, various deposition processes are optimized for a particular thickness range. Hence, it may be desirable, in a manufacturing environment, to use existing deposition processes. If the available nitride deposition process is not sufficiently thick, the conformal oxide layer 322 can be used to supplement the conformal nitride layer 320, such that the total liner thickness Y is sufficiently thick to protect the buried insulator layer 304 during upcoming process steps.

Figure 4:
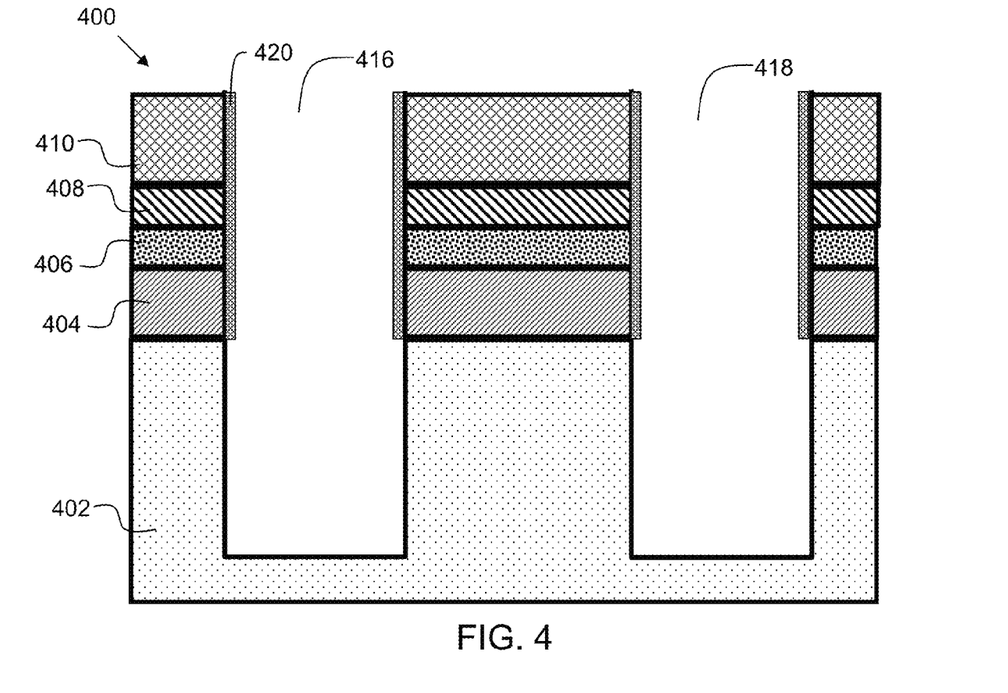
FIG. 4 is a semiconductor structure after a subsequent process step of forming an extended cavity.

FIG. 4 is a semiconductor structure 400 after a subsequent process step of forming extended cavity 416 and 418. The extended cavities 416 and 418 extend partway into bulk semiconductor substrate 402. The extended cavities 416 and 418 may be used to form the deep trench of a deep trench capacitor. Deep trench (DT) capacitors are used in a variety of semiconductor integrated circuits, including DRAM integrated circuits, where circuit density is an important factor in enabling chips with higher storage capacities. The extended cavities 416 and 418 may be formed using an anisotropic etch process such as a reactive ion etch (RIE) process. During the RIE to form the extended cavities, the conformal oxide layer may be completely consumed (compare with 322 of FIG. 3). The conformal nitride layer 420 may be partially consumed, and thus, the layer 420 may be thinner than the originally deposited layer 220. However, even if it is thinner than originally deposited, layer 420 continues to cover and protect the inner sidewall of the buried insulator layer 404. In some embodiments, the extended cavities 416 and 418 may have an aspect ratio ranging from about 40:1 to about 50:1. The aspect ratio is the ratio of height to width of the cavity. Thus a cavity with an aspect ratio of 40:1 has a height that is 40 times greater than its width. As an example, with such an aspect ratio, a cavity with a width of 90 nanometers has a height, or depth, of 3600 nanometers.

Figure 5:
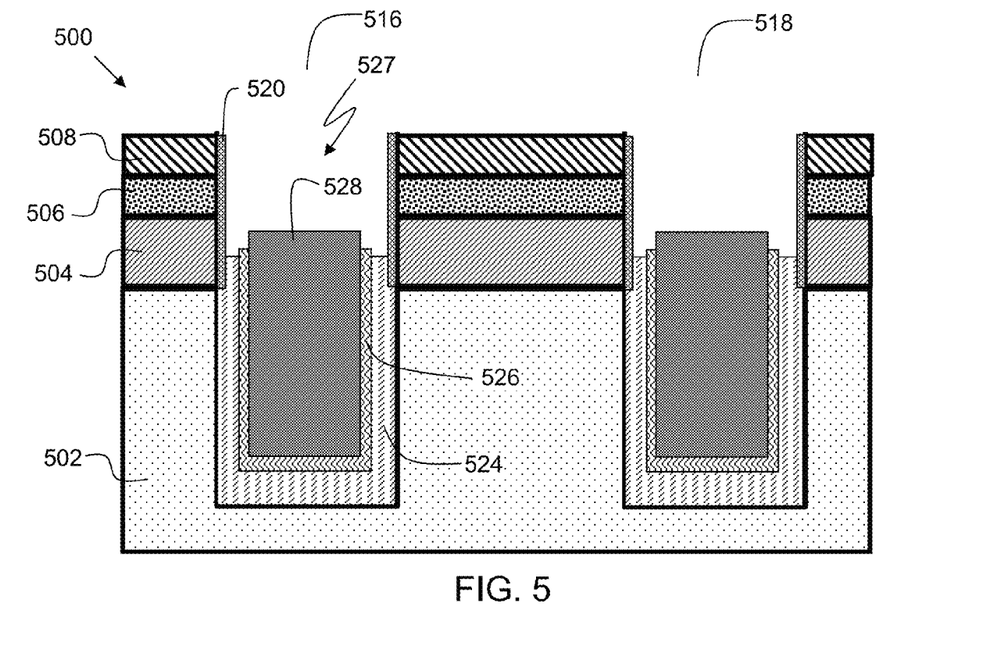
FIG. 5 is a semiconductor structure after a subsequent process step of forming and recessing a capacitor stack.

FIG. 5 is a semiconductor structure 500 after a subsequent process step of forming and recessing a capacitor stack 527. The capacitor stack may comprise a conformal dielectric layer 524. In embodiments, the dielectric layer 524 may be comprised of hafnium oxide. In other embodiments, the dielectric layer 524 may be comprised of zirconium oxide. In yet other embodiments, the dielectric layer 524 may include hafnium silicate, lanthanum oxide, and/or aluminum oxide. Some embodiments may utilize a mixture of these materials for dielectric layer 524. The capacitor stack may further comprise a conformal conductive liner 526. In embodiments, the conductive liner 526 may be comprised of titanium nitride. The capacitor stack may further comprise a conductive material 528. In embodiments, conductive material 528 may comprise polysilicon. In embodiments, each layer of the capacitor stack 527 may be deposited, and then planarized (e.g. with a chemical mechanical polish (CMP) process) and etched to recess the capacitor stack to a level below the bottom of the SOI layer 506.

Figure 6:
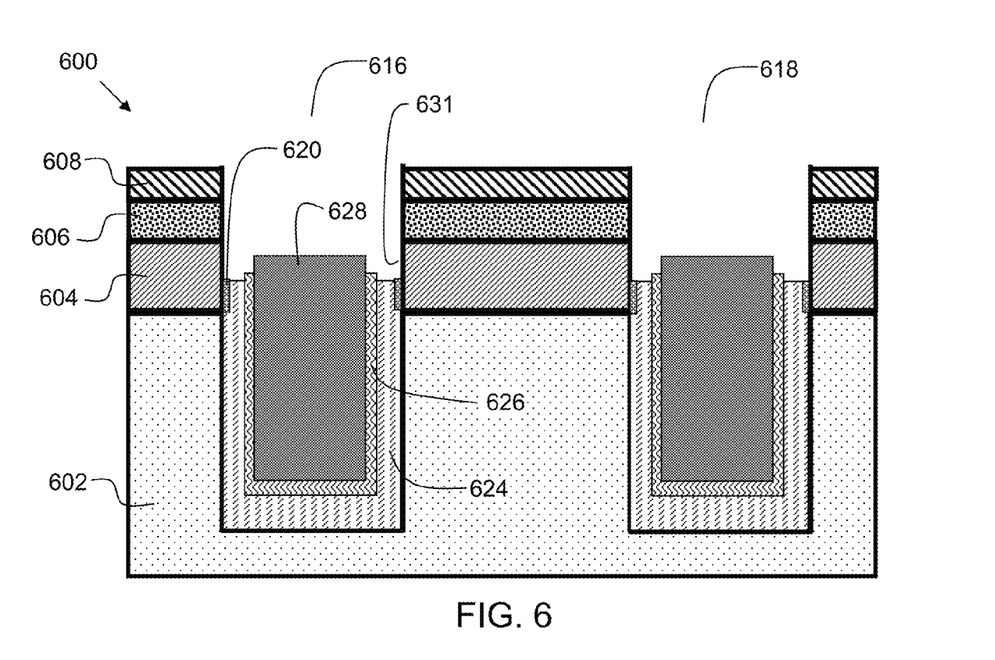
FIG. 6 is a semiconductor structure after a subsequent process step of removing a portion of the conformal nitride layer.

FIG. 6 is a semiconductor structure 600 after a subsequent process step of removing a portion of the conformal nitride layer (compare 620 of FIG. 6 with 520 of FIG. 5). In embodiments, the conformal nitride layer is etched with an isotropic etch process. In some embodiments, a wet etch process is used. In particular embodiments, a hot phosphoric acid etch process is used to remove a portion of the conformal nitride layer. In other embodiments, an isotropic plasma etch process is used to remove a portion of the conformal nitride layer. The conformal nitride (buried insulator protection) layer is removed from the sidewalls of the SOI layer 606. This facilitates electrical connection of a deep trench capacitor to an adjacent transistor (not shown). The buried insulator protection layer is partially removed from the sidewalls of the buried insulator layer 604 to reveal exposed sidewall 631 of the buried insulator layer 604. Furthermore, while the buried insulator protection layer is removed from the sidewalls, it is not over-etched enough to completely remove layer pad 608, which may also be comprised of the same material. As a result of the etch to remove the buried insulator protection layer, pad layer 608 is thinned compare with layer 508 of FIG. 5, but still is intact on the top of structure 600.

Figure 7:
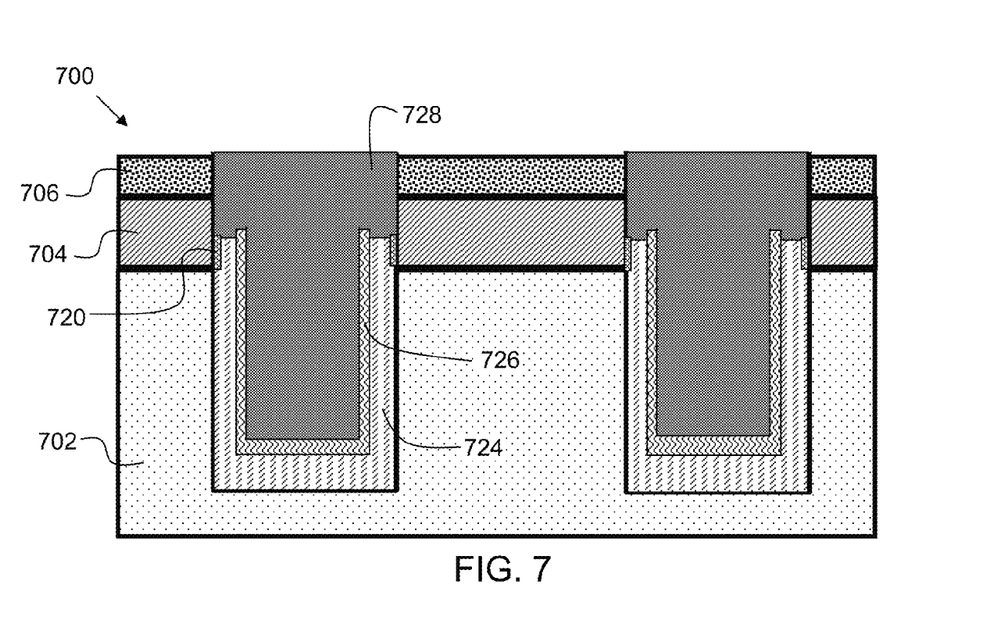
FIG. 7 is a semiconductor structure after a subsequent process step of filling the deep trench cavity.

FIG. 7 is a semiconductor structure 700 after a subsequent process step of filling the deep trench cavity with additional conducting fill material 728. The additional fill material 728 may be polysilicon, and may be similar to the material 528 (see FIG. 5) deposited as part of the initial capacitor stack. A portion of the dielectric layer 724 is in direct physical contact with the buried insulator protection layer 720. The buried insulator protection layer 720 covers a portion of the sidewall of the buried insulator 704. In some embodiments, the buried insulator protection layer 720 is disposed on a lower portion of an inner sidewall of the buried insulator layer 704, and the lower portion comprises between 25 percent to 70 percent of the total inner sidewall height of the buried insulator layer 704. It is important to have the SOI layer 706 completely clear of the buried insulator protection layer 720 to enable connection to transistor source/drain regions as part of the final integrated circuit fabrication.

Figure 8:
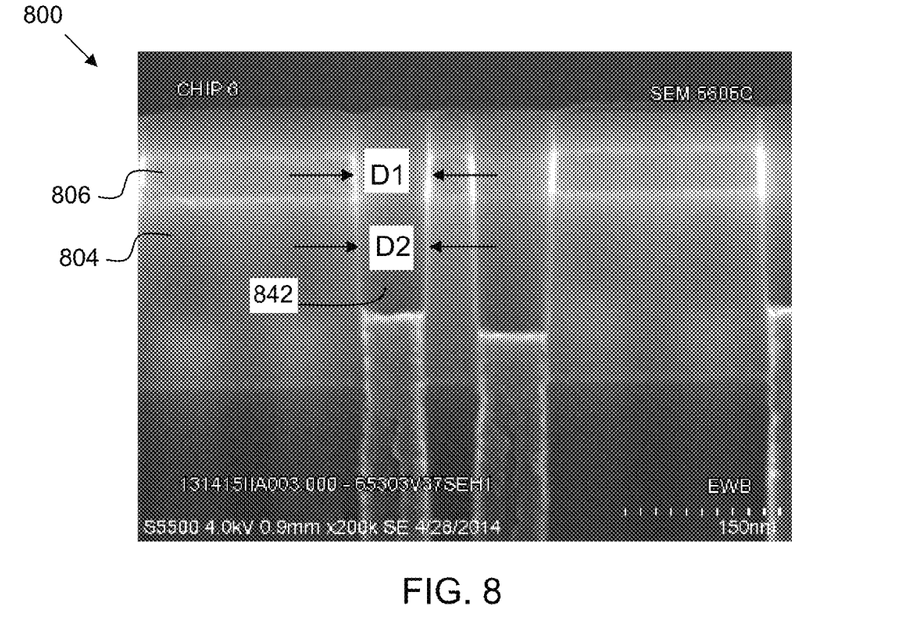
FIG. 8 is a cross section of a deep trench in accordance with embodiments of the present invention.

FIG. 8 is a cross section of a semiconductor structure 800 comprising a deep trench 842 in accordance with embodiments of the present invention. The trench has a width D1 in the region of the SOI layer 806. The trench has a width D2 in the region of the buried insulator layer 804. In structure 800, D1 is greater than or equal to D2.

Figure 9:
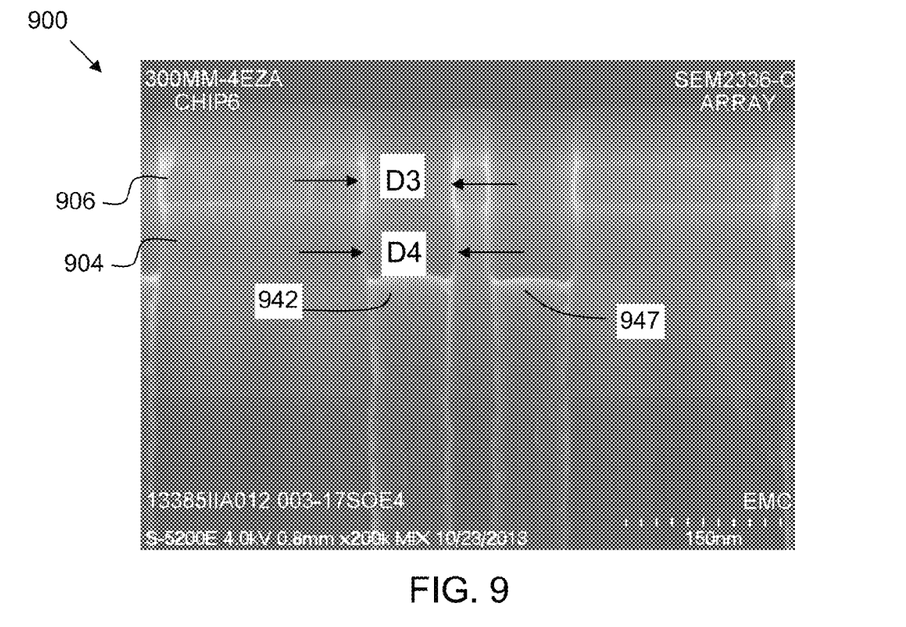
FIG. 9 is a cross section of a deep trench formed without a conformal insulator layer.

FIG. 9 is a cross section of a semiconductor structure 900 comprising a deep trench 942 formed without a conformal insulator layer. The trench has a width D3 in the region of the SOI layer 906. The trench has a width D4 in the region of the buried insulator layer 904. As can be seen, in structure 900, D4 is greater than or equal to D3. Hence, the trench is wider in the region of buried insulator layer 904 than in the region of SOI layer 906, in contrast to embodiments of the present invention. The wider D4 is, the greater the opportunity for a short circuit between two adjacent trenches, which adversely affects product yield. That is, trench 942 is at risk of shorting to adjacent trench 947 at the buried insulator 904 due to over etch. Hence, embodiments of the present invention can improve product yield by reducing the risk of such short circuits. This is because embodiments of the present invention protect the buried insulator so the trench width in the buried insulator region does not grow wider than the trench width in the SOI region.

Figure 10:
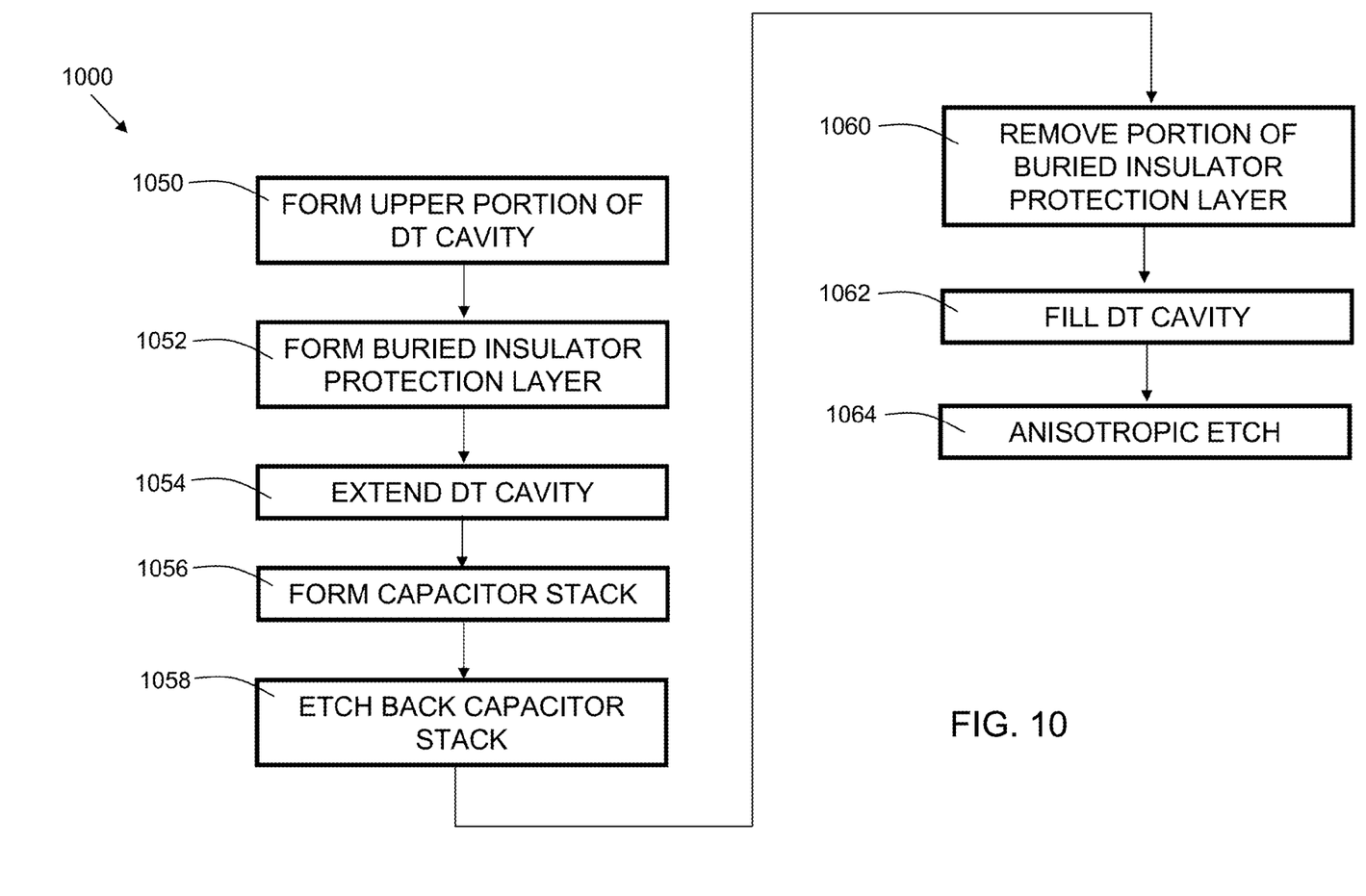
FIG. 10 is a flowchart indicating process steps for embodiments of the present invention.

FIG. 10 is a flowchart 1000 indicating process steps for embodiments of the present invention. In process step 1050, an upper portion of a deep trench cavity is formed (see 116 of FIG. 1). The upper portion cavity traverses the layers disposed above the bulk semiconductor substrate 102, but does not traverse the bulk semiconductor substrate 102 itself. In process step 1052, a buried insulator protection layer is formed (see 220 of FIG. 2). The buried insulator protection layer is disposed on the sidewall of the upper portion of the deep trench cavity. In process step 1054, the cavity is extended (see 416 of FIG. 4). The extending of the cavity may be performed using a reactive ion etch (RIE) process. The buried insulator protection layer remains covering the buried insulator layer sidewalls after the extending of the cavity. In process step 1056, a capacitor stack is formed (see 527 of FIG. 5). The capacitor stack formation may include depositing dielectric layers, liners, and fill materials. In process step 1058, planarization and/or etch processes may be used to recess the capacitor stack such that the buried insulator protection layer (see 520 of FIG. 5) on the sidewalls of the SOI layer (see 506 of FIG. 5) is exposed. IN process step 1060, a portion of the buried insulator protection layer is removed, resulting in the buried insulator protection layer 620 shown in FIG. 6. The sidewall of the SOI layer 606 (FIG. 6) is no longer covered by the buried insulator protection layer. In process step 1062, the remainder of the cavity is filled with a conductive material. In embodiments, polysilicon is used to fill the remainder of the cavity. In process step 1064, the structure is etched anisotropically (e.g with a RIE process), resulting in structure 700 of FIG. 7. From this point forward, industry-standard techniques and processes may be used to complete the fabrication of the integrated circuit. The processes may include formation of transistors, formation of middle-of-line layers, contacts, back-end-of-line layers such as metallization and via layers, and packaging.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:

forming an upper portion cavity in a semiconductor-on-insulator structure comprising a semiconductor-on-insulator (SOI) layer, a buried insulator layer, and a bulk semiconductor substrate, wherein the upper portion cavity terminates at a top surface of the bulk semiconductor substrate;

forming a conformal insulator layer in the upper portion cavity;

extending the upper portion cavity into the bulk semiconductor substrate to form an extended cavity after the step of forming the conformal insulator layer;

forming a capacitor stack in the extended cavity;

removing the conformal insulator layer from a portion of an inner sidewall of the buried insulator layer such that the conformal insulator layer extends from a bottom level of the buried insulator to a point between the bottom level of the buried insulator and a top level of the buried insulator; and filling the extended cavity with a conducting material such that the conductive material contacts the portion of the inner sidewall of the buried insulator layer, and wherein the conducting material is disposed on a side surface and a top surface of the conformal insulator.

2. The method of claim 1, wherein forming a conformal insulator layer comprises depositing a conformal silicon nitride layer.

3. The method of claim 2, wherein forming a conformal insulator layer further comprises depositing a conformal silicon oxide layer on the conformal silicon nitride layer.

4. The method of claim 1, wherein forming a capacitor stack comprises forming a dielectric layer.

5. The method of claim 4, wherein forming a dielectric layer comprises forming a hafnium oxide layer.

6. The method of claim 4, wherein forming a dielectric layer comprises forming a hafnium silicate layer.

7. The method of claim 4, wherein forming a capacitor stack further comprises forming a conductive liner.

8. The method of claim 7, wherein forming a conductive liner comprises forming a titanium nitride liner.

9. The method of claim 7, further comprising depositing a conductive material in the extended cavity.

10. The method of claim 1, wherein removing the conformal insulator layer from the exposed portion of the inner sidewall of the buried insulator layer is performed with a wet etch.

11. The method of claim 10, wherein performing a wet etch comprises performing a hot phosphoric acid etch.

12. The method of claim 1, wherein removing the capacitor stack from a portion of the upper portion cavity to expose a portion of an inner sidewall of the buried insulator layer comprises exposing between 25 percent to 70 percent of the inner sidewall of the buried insulator layer.

* * * * *